US006993809B2

(12) United States Patent
Chin-Kang

(10) Patent No.: US 6,993,809 B2
(45) Date of Patent: Feb. 7, 2006

(54) WAFER BOX WITH A HANDLE DEVICE

(75) Inventor: Chang Chin-Kang, Taipei (TW)

(73) Assignee: Power Geode Technology Co., Ltd., Taipei (TW)

( * ) Notice: Subject to any disclaimer, the term of this patent is extended or adjusted under 35 U.S.C. 154(b) by 20 days.

(21) Appl. No.: 10/789,782

(22) Filed: Feb. 27, 2004

(65) Prior Publication Data

US 2004/0173499 A1 Sep. 9, 2004

(30) Foreign Application Priority Data

Mar. 5, 2003 (TW) ............................. 92203342 U

(51) Int. Cl.
*B65D 85/30* (2006.01)
(52) U.S. Cl. .................. 16/425; 206/710; 206/454; 206/832; 220/759
(58) Field of Classification Search .............. 206/710, 206/711, 712, 454, 832; 190/39; 220/759, 220/762; 16/900, 422, 425
See application file for complete search history.

(56) References Cited

U.S. PATENT DOCUMENTS

| | | | | |
|---|---|---|---|---|
| 2,024,294 A | * | 12/1935 | Kirsch | .................... 220/759 |
| 2,621,357 A | * | 12/1952 | Stuman | ........................ 16/422 |
| 4,827,567 A | * | 5/1989 | Beach | .......................... 16/422 |
| 5,445,271 A | * | 8/1995 | Kakizaki et al. | ......... 206/459.5 |
| 6,010,008 A | * | 1/2000 | Nyseth et al. | .............. 206/711 |
| 6,382,419 B1 | * | 5/2002 | Fujimori et al. | ............ 206/454 |
| 6,398,033 B1 | * | 6/2002 | Wu et al. | .................... 206/711 |
| 2004/0124118 A1 | * | 7/2004 | Matsurtori et al. | ......... 206/710 |
| 2004/0232036 A1 | * | 11/2004 | Matsutori et al. | ........... 206/710 |

FOREIGN PATENT DOCUMENTS

GB 2135957 A * 9/1984

* cited by examiner

*Primary Examiner*—Mickey Yu
*Assistant Examiner*—Jerrold Johnson
(74) *Attorney, Agent, or Firm*—Haverstock & Owens LLP

(57) ABSTRACT

A wafer box with a handle device is provided. A wafer box includes a wafer box main body for carrying at least one wafer, a handle device having a holding portion being evenly and securely held by an operator with digits so as to transport the wafer box conveniently, and a connecting component for connecting the wafer box main body to the handle device. The connecting component further includes an engaging portion for being engaged with the wafer box main body, a positioning portion for positioning the connecting component on the wafer box main body, and an urging portion for urging against the wafer box main body.

2 Claims, 8 Drawing Sheets

US 6,993,809 B2

WAFER BOX WITH A HANDLE DEVICE

FIELD OF THE INVENTION

The present invention relates to a wafer box with a handle device, and more particularly to a wafer box with a handle device for facilitating the transportation of the front-opening shipping box in both vertical and horizontal directions.

BACKGROUND OF THE INVENTION

Generally, there are two types of 12-inch front opening wafer boxes. One is the front-opening unified pod (FOUP) for the indoor processing usage, and the other is the front-opening shipping box (FOSB) for the outdoor transportation usage. During the transportation of the FOSB the opening faces upward, but when the wafers are taken out from the FOSB, the opening faces forward. Therefore, a handle device has been designed for conveniently changing the opening direction of a wafer box.

Please refer to FIG. 1, which is a three-dimensional view showing a wafer box with a handle device according to the prior art. The handle device 10 with the circular holding portion 11 is connected to the wafer box 20 via the engaging portion 12. The operator can grip the handle device 10 when transporting the wafer box. Please refer to FIG. 2, which is a three-dimensional side view showing a wafer box according to the prior art. The wafer box 20 includes the placing portion 21 for placing the engaging portion 12 and includes the edge 22 of gradually decreased width for tightly enhancing the connection between the wafer box 20 and the handle device 10. However, as shown in FIG. 1, the handle device 10 has the circular holding portion 11. Therefore, it is not easy to hold the wafer box evenly and securely with digits, and it is quite easy that the wafer box is slipped off the hands of the operator during the transportation. Due to the foregoing reasons, the operator often transports the wafer box by directly holding the box in his arms, which is an inadequate method to transport a wafer box.

From the above description, it is known that the design of the handle device with a circular holding portion is not ideal for transportation. Therefore, how to facilitate the transportation and stabilize the transportation process have become major problems waited to be solved in the industry. In order to overcome the drawbacks in the prior art, a wafer box with a handle device is provided. The particular design in the present invention not only solves the problem that the wafer boxes are easily slipped off the hands, but also enhances the stability of holding the wafer boxes during the transportation.

SUMMARY OF THE INVENTION

The main purpose of the present invention is to provide a wafer box with a handle device for facilitating the transportation of wafer boxes in both vertical and horizontal directions.

It is one object of the present invention to provide a handle device with a holding portion for holding the wafer box evenly and securely with digits.

It is another object of the present invention to provide a positioning portion for accurately connecting a wafer box main body with a connecting component.

It is another object of the present invention to provide an urging portion for urging against a wafer box main body so as to facilitate the transportation.

In accordance with an aspect of the present invention, a wafer box includes a wafer box main body for carrying at least one wafer, and a handle device. The handle device includes a holding element having a holding portion being evenly and securely held by an operator with digits thereof so as to transport the wafer box, and a connecting component for connecting the wafer box main body to the handle device. The connecting component includes an engaging portion for being engaged with the wafer box main body, a positioning portion for positioning the connecting component on the wafer box main body, and an urging portion for urging against the wafer box main body.

Preferably, the wafer box main body further includes a first placing portion and a second placing portion, and the engaging portion and the positioning portion are wedged respectively into the first and second placing portions.

Preferably, the wafer box is a front opening shipping box (FOSB), and the holding element is a bar portion.

Preferably, the holding portion of the handle device is connected to the wafer box main body in a horizontal direction for facilitating the transportation in a vertical direction, and a longitudinal direction of the holding portion is parallel to the horizontal direction.

Preferably, the engaging portion and the positioning portion of the connecting component have a first contacting point and a second contacting point respectively so as to be connected to a first contacted portion and a second contacted portion of the wafer box main body.

Preferably, the holding portion of the handle device is connected to the wafer box main body in a vertical direction for facilitating the transportation in a horizontal direction, and a longitudinal direction of the holding portion is perpendicular to the vertical direction.

Preferably, the positioning portion of the connecting component has a horizontal contact point so as to be connected to a horizontal contact portion of the wafer box main body.

Preferably, the urging portion has a third contacting point for being connected to a third contacted portion of the wafer box main body.

Preferably, the engaging portion has a pillar for connecting the engaging portion to the connecting component so as to form a gap-connecting portion for being engaged with an edge of the wafer box main body.

Preferably, the engaging portion is placed between the edge of the wafer box main body and the wafer box main body through the pillar so that the connecting component is mounted on the wafer box main body.

Preferably, the edge has a gradually increased thickness for enhancing the connecting component to be mounted on the wafer box main body.

Preferably, the engaging portion has a tapering column mounted on the pillar and forms together with the connecting component and the pillar the gap-connecting portion.

Preferably, the positioning portion and the urging portion of the connecting component respectively has a circular shape.

In accordance with another aspect of the present invention, a handle device includes a connecting component connected to an object, and a holding element. The connecting component includes an engaging portion for being engaged with the object, a positioning portion for positioning the connecting component on the object. The holding element mounted on the connecting component has a holding portion being evenly and securely held by an operator with four digits thereof so as to transport the object.

Preferably, the object is a wafer box main body.

Preferably, the connecting component further includes an urging portion for urging the object.

The foregoing and other features and advantages of the present invention will be more clearly understood through the following descriptions with reference to the drawings, in which:

DETAILED DESCRIPTION OF THE PREFERRED EMBODIMENT

Figure 1:
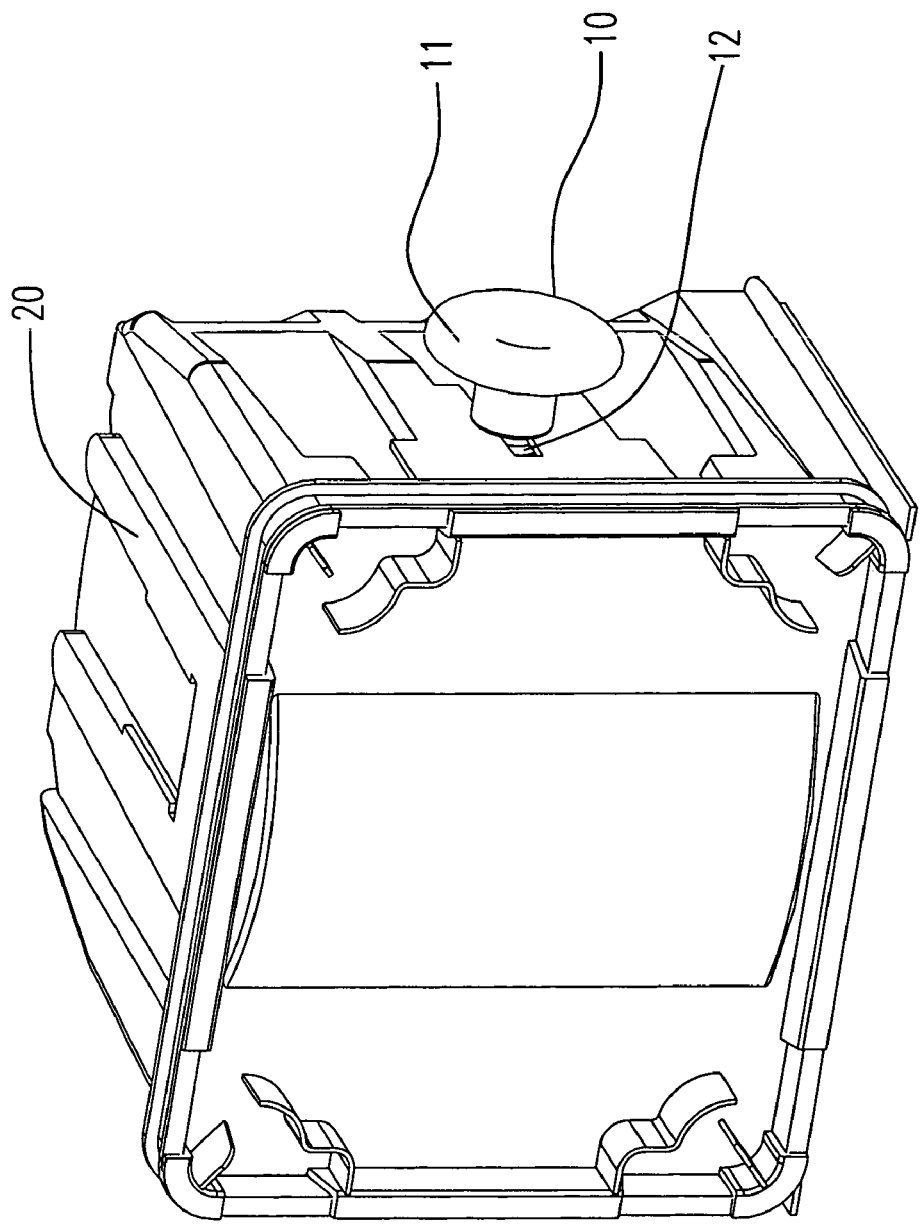
FIG. 1 is a three-dimensional view showing a wafer box with a handle device according to the prior art.
Figure 2:
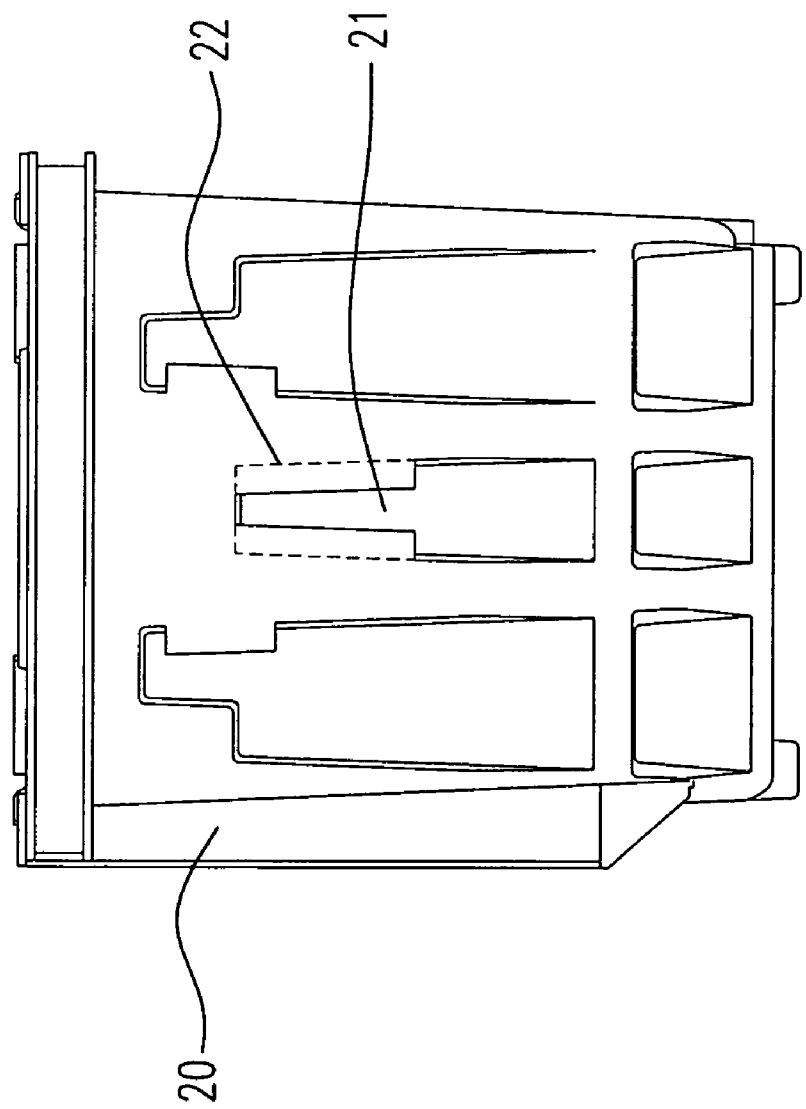
FIG. 2 is a three-dimensional side view showing a wafer box according to the prior art.
Figure 3:
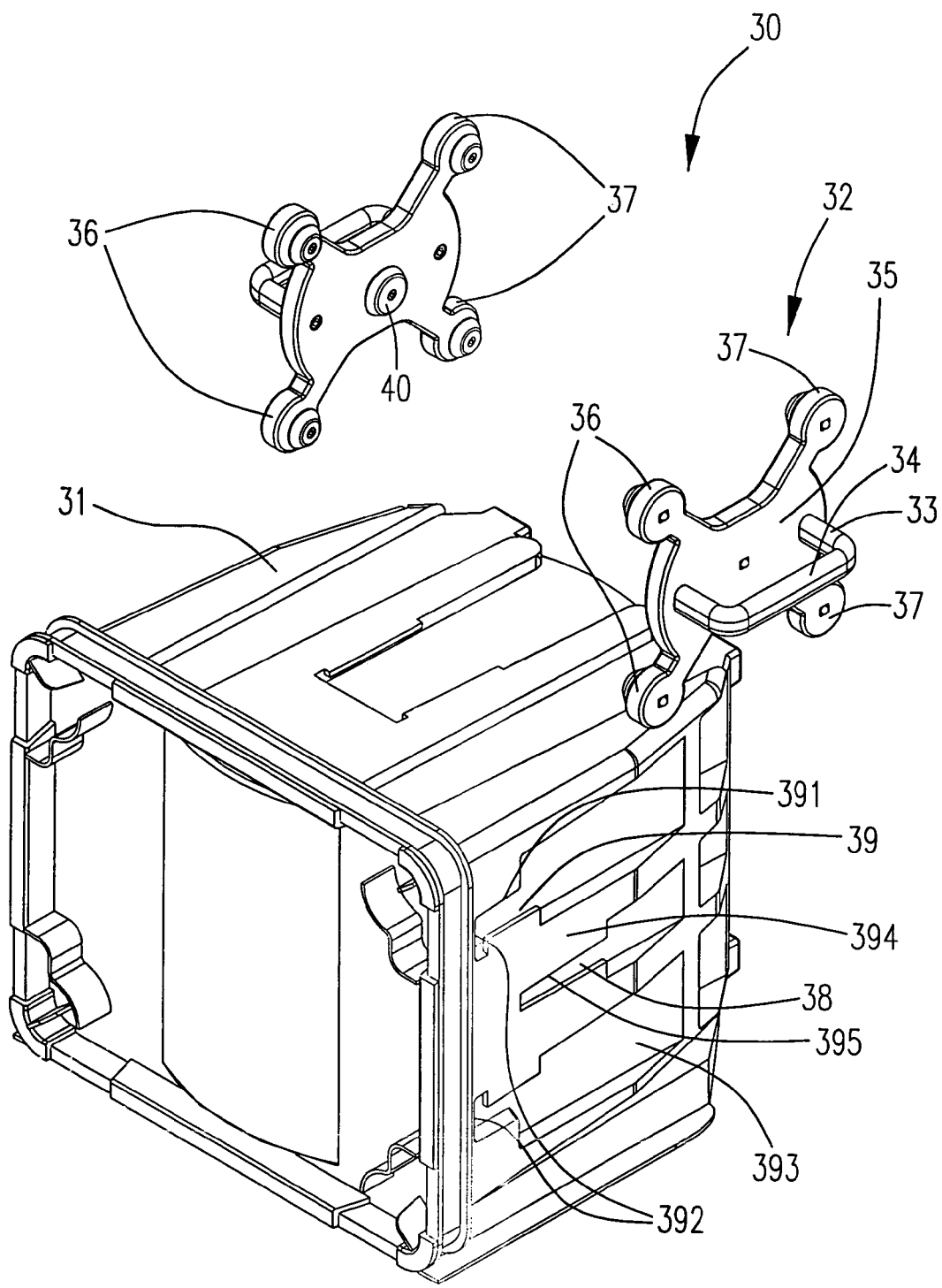
FIG. 3 is a three-dimensional view showing a wafer box with a handle device according to a preferred embodiment of the present invention.

The present invention will now be described more specifically with reference to the following embodiments. Please refer to FIG. 3, which is a three-dimensional view showing a wafer box with a handle device according to a preferred embodiment of the present invention. The wafer box 30 is a front opening shipping box (FOSB), but is not limited to FOSB. The wafer box 30 includes the wafer box main body 31 and two handle devices 32. Each handle device has one holding element 33, one engaging portion 40, two positioning portion 36, and two urging portion 37. The wafer box main body 31 carries at least one 12-inch wafer during the transportation. The handle devices 32 are designed to facilitate the transportation process of the wafer box 30.

The handle device 32 includes the holding element 33 and the connecting component 35. The holding element 33 mounted on the connecting component 35 has the holding portion 34 of bar portion. The design of the bar portion can be evenly held by an operator with four digits, and therefore it is not easy to be slipped off the hands of the operator. Since the holding portion 34 can be held evenly and securely, it is convenient to change the opening direction of a wafer box. Furthermore, the moving stability of the wafers in the wafer box is also achieved. The connecting component 35 includes the engaging portion 40, the positioning portion 36, and the urging portion 37. The engaging portion 40 is engaged with the wafer box main body 31. The positioning portion 36 has the function to locate the connecting component 35 on the wafer box main body 31. The urging portion 37 urges against the wafer box main body 31.

The wafer box main body 31 includes the first placing portion 38, the second placing portion 39, the first contacted portion 395, the second contacted portion 391, the third contacted portion 393, the horizontal contacted portion 392, and the edge 394. The engaging portion 40 and the positioning portion 36 are wedged respectively into the first placing portion 38 and the second placing portions 39. In the present invention, the positioning portion 36 and the urging portion 37 have the same structure, but they are defined according to where they are located. The positioning portion 36 is placed into the second placing portion 39. The urging portion 37 urges the third contact portion 393.

Figure 4:
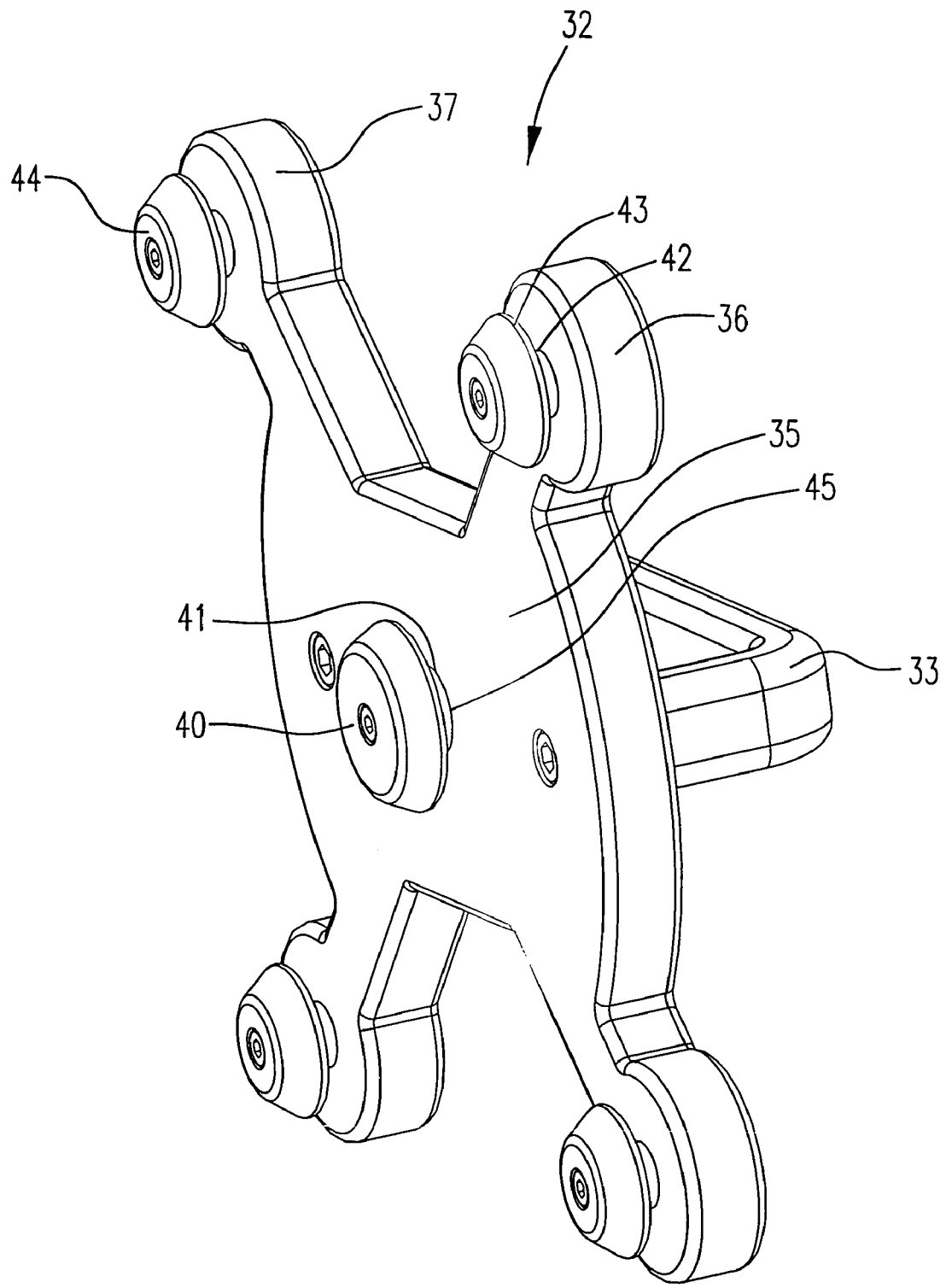
FIG. 4 is a three-dimensional view showing a handle device according to a preferred embodiment of the present invention.

Please refer to FIG. 4, which is a three-dimensional view showing a handle device according to a preferred embodiment of the present invention. The handle device 32 includes the holding element 33 and the connecting component 35. The connecting component 35 includes the engaging portion 40, the positioning portion 36, and the urging portion 37. The engaging portion 40 and the positioning portion 36 respectively have the first contacting point 41 and the second contacting point 42. The first contacting point 41 and the second contacting point 42 are respectively connected to the first contacted portion 395 and the second contacted portion 391 of the wafer box main body 31. Further, the urging portion 37 has the third contacting point 44 to urge against the third contacted portion 393 of the wafer box main body 31. In addition, the positioning portion 36 has the horizontal contact point 43 to be connected to the horizontal contact portion 392 of the wafer box main body 31.

Figure 7:
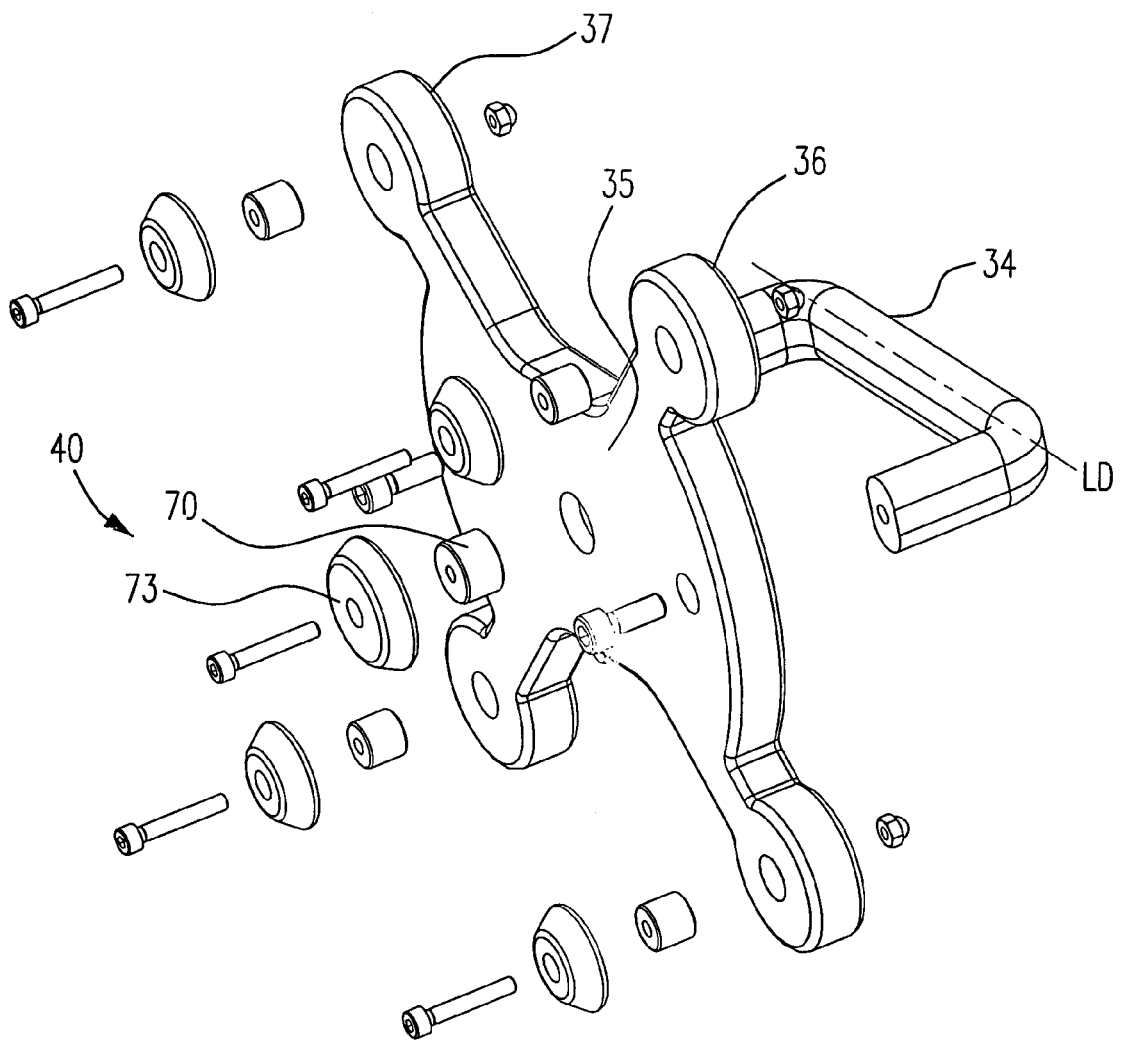
FIG. 7 is a three-dimensional view showing a handle device according to a preferred embodiment of the present invention.
Figure 8:
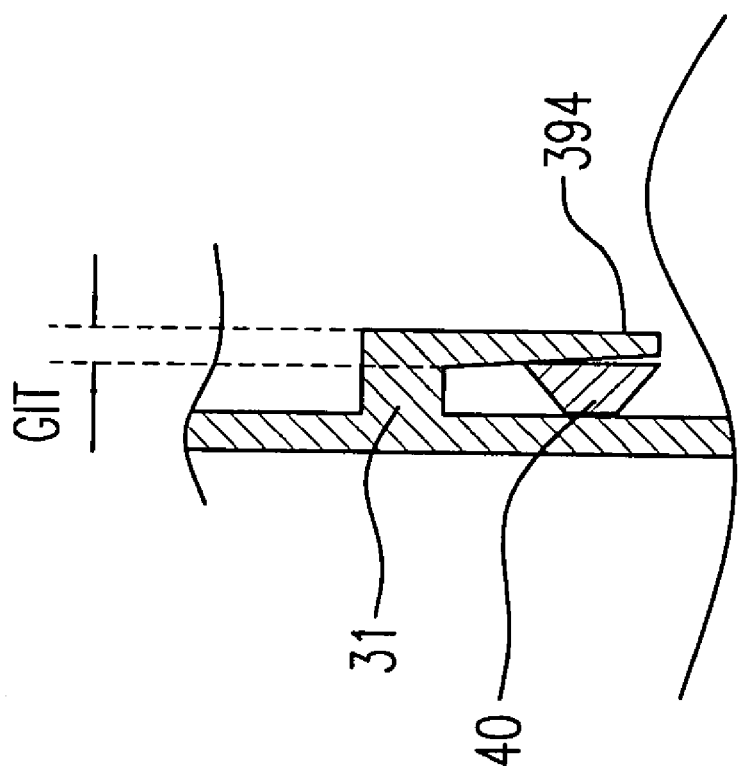
FIG. 8 is a cross-section view showing the edge of a wafer box according to a preferred embodiment of the present invention.

In FIG. 4, the gap-connecting portion 45 is shown as well. Please further refer to FIG. 7 and FIG. 8. FIG. 7 is a three-dimensional view showing a handle device according to a preferred embodiment of the present invention. The positioning portion 36 and the urging portion 37 have the circular shape. The holding portion 34 has a longitudinal direction LD. The engaging portion 40 has the pillar 70 and the tapering column 73. The tapering column 73 is mounted on the pillar 70. The gap-connecting portion 45 is formed between the engaging portion 40 and the connecting component 35. Please also refer to FIG. 8, which is a cross-section view showing a edge of a wafer box according to a preferred embodiment of the present invention. The gap-connecting portion 45 is engaged with the edge 394 of the wafer box main body 31. The engaging portion 40 is placed between the edge 394 and the wafer box main body 31 through the pillar 70 so that the connecting component 35 can be mounted on the wafer box main body 31. Moreover, the edge 394 has a gradually increased thickness (GIT). The gradually increased thickness enhances the connecting component 35 to be mounted on the wafer box main body 31. The above structure design allows the handle device 32 tightly mounted on the wafer box main body 31. And through using the holding element 33 of bar portion, the operator can evenly hold the wafer box and convert the direction of the wafer box with four digits. Therefore, the stability of the wafers are well-maintained when the wafer box is transported to a certain position for wafer examination, or transported to an interface platform for converting the wafers into the front opening united pod.

Figure 5:
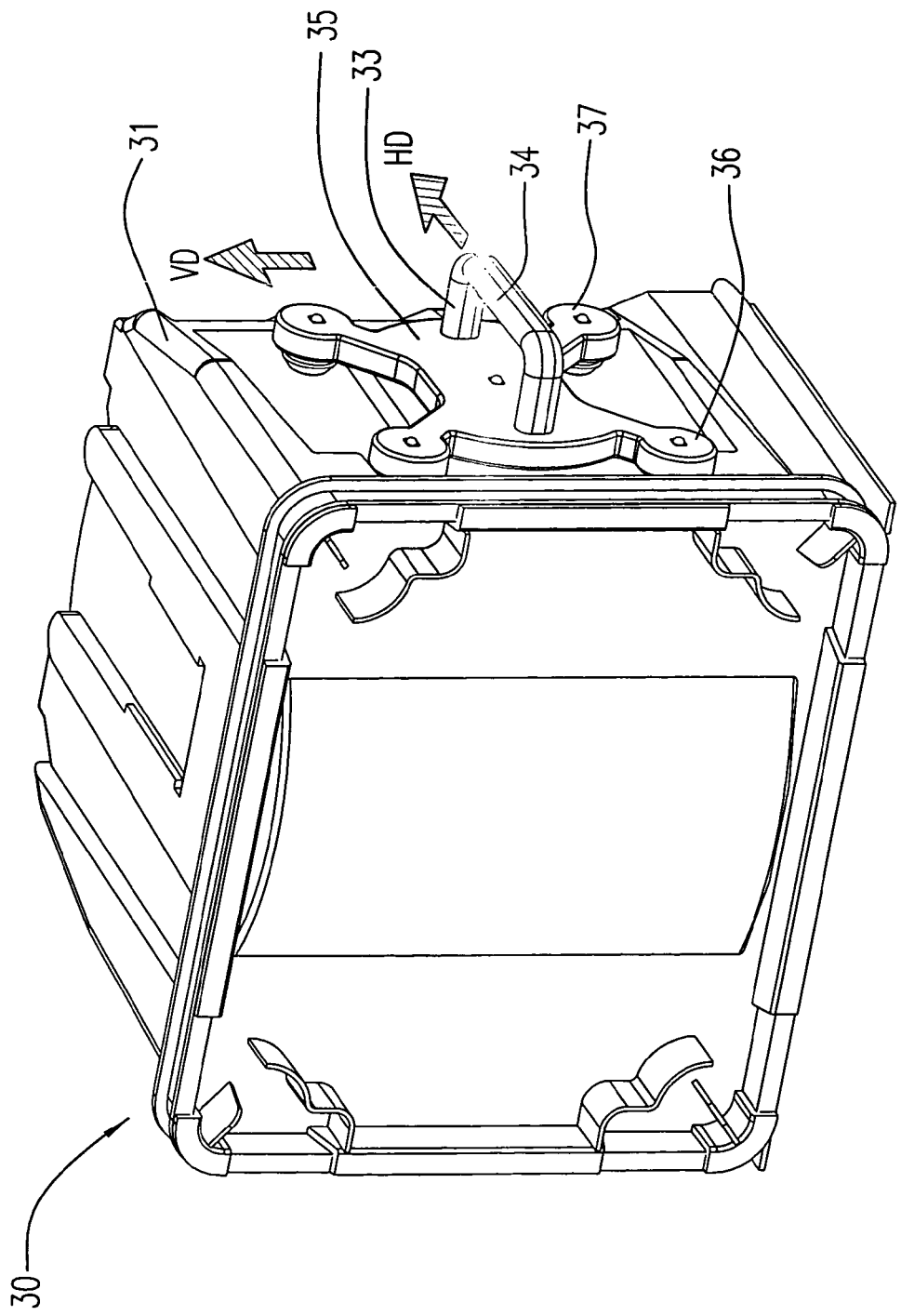
FIG. 5 is a three-dimensional view showing a wafer box with a handle device of a horizontal combination according to a preferred embodiment of the present invention.

In a preferred embodiment, the present invention provides a wafer box with a handle device. The transportation of wafer boxes is facilitated in both vertical and horizontal directions. In a vertical transportation (VD), please refer to FIG. 5, which is a three-dimensional view showing a wafer box with a handle device of a horizontal combination. The holding portion 34 of the handle device 32 is connected to the wafer box main body 31 in a horizontal direction. The longitudinal direction of the holding portion 34 is parallel to the horizontal direction. In this vertical transportation (VD), the opening of the wafer box faces forward, and the wafer is easily to be taken out for examination or for transferring into another wafer box.

Figure 6:
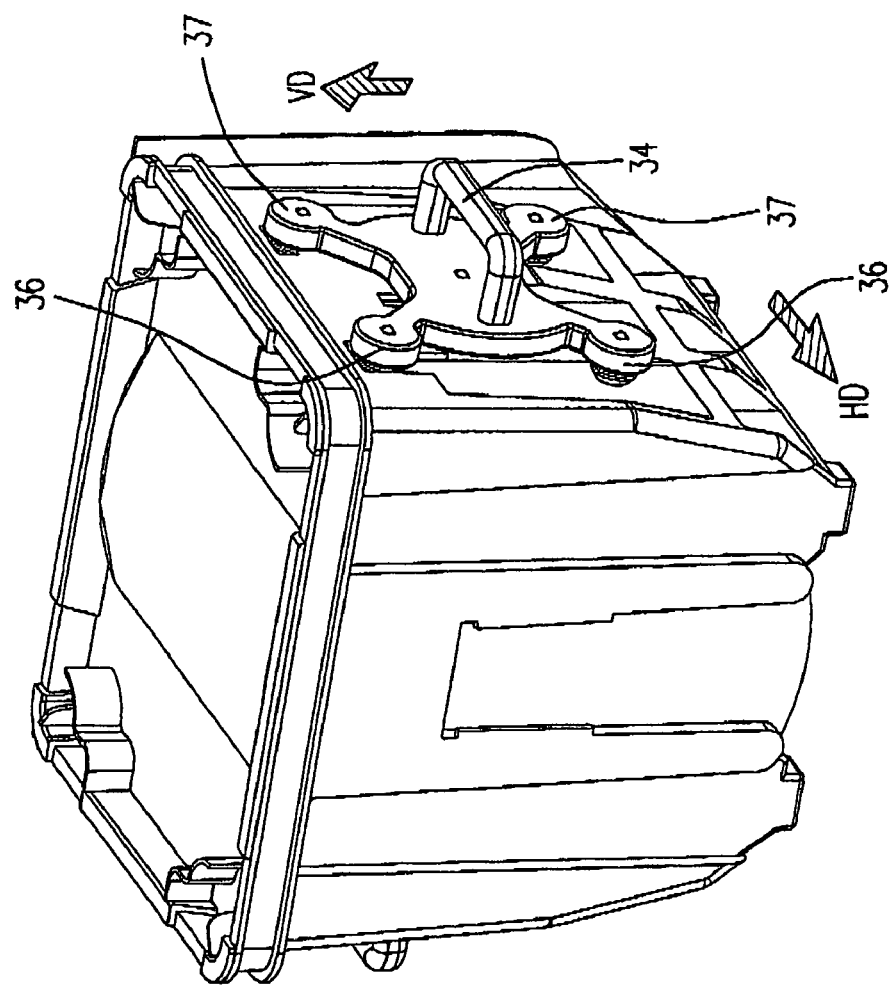
FIG. 6 is a three-dimensional view showing a wafer box with a handle device of a vertical combination according to a preferred embodiment of the present invention.

In a horizontal transportation, the opening of the wafer box faces forward. Please refer to FIG. 6, which is a three-dimensional view showing a wafer box with a handle device of a vertical combination. The holding portion 34 of the handle device is connected to the wafer box main body 31 in a vertical direction. The longitudinal direction of the holding portion 34 is perpendicular to the vertical direction. From the above, the transportation of wafer boxes in both vertical and horizontal directions provides a new application for the industries to overcome the inconvenience of the prior art.

In another preferred embodiment of the present invention, the handle device 32 includes the connecting component 35, and the holding element 33. The connecting component 35 includes the engaging portion 40, the positioning portion 36, and further includes the urging portion 37. The connecting component 35 is connected to an object, the object is a wafer box, but is not limited to. The details of the embodiment have been disclosed in the previous description.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A handle device, comprising:
   a connecting component for connection with an object, comprising:
   means for engaging with said object;
   means for positioning said connecting component on said object;
   a holding element mounted on said connecting component and having a holding portion for being evenly and securely held by an operator with four digits thereof so as to transport said object; and
   means for urging said object.

2. A handle device according to claim 1, wherein said object is a wafer box main body.

* * * * *

UNITED STATES PATENT AND TRADEMARK OFFICE
CERTIFICATE OF CORRECTION

PATENT NO. : 6,993,809 B2  Page 1 of 1
APPLICATION NO. : 10/789782
DATED : February 7, 2006
INVENTOR(S) : Chin-Kang It is certified that error appears in the above-identified patent and that said Letters Patent is hereby corrected as shown below:

Title page, item [56]
IN THE REFERENCES CITED - U.S. PATENT DOCUMENTS - p. 1

Replace "Matsurtori" with --Matsutori-- for the 2004/0124118 reference.

Signed and Sealed this

Twenty-fifth Day of July, 2006

JON W. DUDAS
*Director of the United States Patent and Trademark Office*